United States Patent
Yoo et al.

(10) Patent No.: US 11,456,408 B1
(45) Date of Patent: Sep. 27, 2022

(54) AIR-WATER-SEDIMENT INTERFACE DETECTION SENSORS, SYSTEMS, AND METHODS

(71) Applicant: The Government of the United States of America, as represented by the Secretary of the Navy, Arlington, VA (US)

(72) Inventors: JinHyeong Yoo, Germantown, MD (US); Nicholas J. Jones, Fairfax, VA (US); Rachel N. Jacobs, Rockville, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 444 days.

(21) Appl. No.: 16/738,907

(22) Filed: Jan. 9, 2020

Related U.S. Application Data

(60) Provisional application No. 62/790,222, filed on Jan. 9, 2019.

(51) Int. Cl.
*H01L 41/12* (2006.01)
*G01R 33/385* (2006.01)
*H01F 1/03* (2006.01)
*H01L 41/20* (2006.01)
*E21B 41/00* (2006.01)

(52) U.S. Cl.
CPC ........ *H01L 41/125* (2013.01); *G01R 33/3854* (2013.01); *H01F 1/0306* (2013.01); *H01L 41/20* (2013.01); *E21B 41/0085* (2013.01)

(58) Field of Classification Search
None
See application file for complete search history.

(56) References Cited

U.S. PATENT DOCUMENTS

| | | | |
|---|---|---|---|
| 2004/0212362 A1* | 10/2004 | Baudendistel | G01R 33/1223 324/201 |
| 2018/0259599 A1* | 9/2018 | Finkel | G01R 33/0286 |
| 2019/0198749 A1* | 6/2019 | Behera | H01L 41/042 |
| 2020/0076332 A1* | 3/2020 | Nakamura | H02N 2/188 |

* cited by examiner

*Primary Examiner* — Benjamin P Sandvik
(74) *Attorney, Agent, or Firm* — Dawn C. Russell; Dave A. Ghatt

(57) ABSTRACT

Active-mode sensors are provided, and may be used to detect air, water, and sediment interfaces. Systems and methods for sensing air, water, and sediment are also provided. The sensors are robust and withstand forces due to moving or shifting water and sediment.

20 Claims, 8 Drawing Sheets

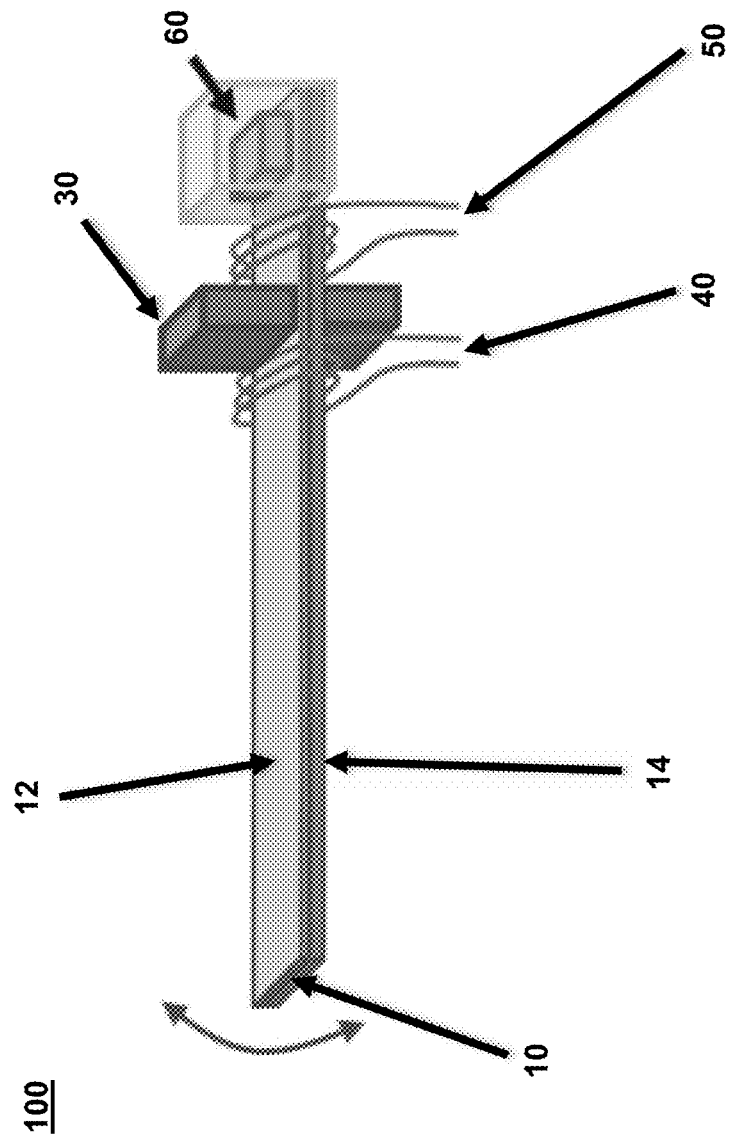

AIR-WATER-SEDIMENT INTERFACE DETECTION SENSORS, SYSTEMS, AND METHODS

CROSS-REFERENCE TO RELATED APPLICATIONS

This application claims priority under 35 U.S.C. § 119(e) to U.S. Provisional Application No. 62/790,222, filed on Jan. 9, 2019. The entire contents of this application are incorporated herein by reference.

FIELD OF THE INVENTION

This invention is directed to active-mode sensors that may be used to detect air, water, and sediment interfaces, as well as systems and methods for sensing air, water, and sediment. The sensor is robust and withstands forces due to moving or shifting water and sediment.

BACKGROUND OF THE INVENTION

FeGa-based alloys ($Fe_{1-x}Ga_x$, "Galfenol") belong to a branch of magnetic materials called "magnetostrictive" materials, which change their dimensions in response to changes in magnetization. [A. E. Clark et al., "Modern magnetostrictive materials: classical and nonclassical alloys," Proc. SPIE 4699, *Smart Structures and Materials 2002: Active Materials: Behavior and Mechanics* (11 Jul. 2002).] Magnetostrictive materials also experience an inverse effect, called the Villari effect, where magnetization and permeability changes occur in response to changes in applied stress/strain. [F. T. Calkins et al., "Overview of Magnetostrictive Sensor Technology," *Journal of Intelligent Material Systems and Structures*, vol. 18, issue 10, pp. 1057-1066 (1 Oct. 2007).]

These Fe-based multifunctional materials are uniquely ductile and appear to have an excellent ability to withstand mechanical shock under both compression and tension. These mechanical properties allow for applications under tension, including large flexure deformations in Galfenol sheets. Previous research utilized this flexibility, showing that passive sensors composed of Galfenol-based "whiskers" could be used to determine the presence or absence of sediment in underwater applications. [S. R. Day et al., "The design and construction of a scour monitoring system", *Proc. SPIE 9061, Sensors and Smart Structures Technologies for Civil, Mechanical, and Aerospace Systems* 2014, 90610F (10 Apr. 2014)), R. A. Swartz et al., "Bio-inspired magnetostrictive whisker sensors for autonomous bridge scour sensing," TRB 93rd Annual Meeting Compendium of Papers (2014).] The whiskers had different flexural responses when surrounded by water or sediment, which produced a significant difference in the magnetic response of the Galfenol due to these deflections.

While passive-mode sensors have been previously demonstrated, these sensors can have difficulties sensing in no or low-flow applications. There is a need in the art for active-mode sensors that can provide information, particularly regarding tank contents, regardless of flow conditions or movement of water.

SUMMARY OF THE INVENTION

The invention described herein, including the various aspects and/or embodiments thereof, meets the unmet needs of the art, as well as others, by providing active-mode sensors that may be used to detect air, water, and sediment interfaces, as well as systems and methods for sensing air, water, and sediment. The sensor is robust and withstands forces due to moving or shifting water and sediment.

According to a first aspect of the invention, a sensor is provided. The sensor includes a magnetostrictive beam; a clamp provided on the magnetostrictive beam, configured so a first portion of the magnetostrictive beam on a first side of the clamp undergoes fixed-free vibration in response to changes in magnetic fields, and a second portion of the magnetostrictive beam on a second side of the clamp; a permanent magnet provided on the second portion of the magnetostrictive beam; and pickup and driver coils provided on either side of the clamp. The driver coil generates a known magnetic field, and the pickup coil measures the magnetic field response of the first portion of the magnetostrictive beam to the known magnetic field. The magnetic field response varies based on whether air, water, or sediment is adjacent to the magnetostrictive beam.

Another aspect of the invention, a method for sensing is provided. The method includes providing a volume that contains one or more media comprising air, water, and sediment in varying amounts; providing two or more sensors within the volume, each sensor comprising a magnetostrictive beam configured to have a first portion of that undergoes fixed-free vibration in response to changes in magnetic fields, and a second portion having a permanent magnet affixed thereto; generating a known magnetic field around the magnetostrictive beam of each of the two or more sensors; and detecting a magnetic field response in the first portion of the magnetostrictive beam of each of the two or more sensors. The magnetic field response of the magnetostrictive beam varies depending on whether the magnetostrictive beam is surrounded by air, water, or sediment, or combinations thereof.

A further aspect of the invention provides a sensing system. The system includes an array of active-mode magnetostrictive sensors, each sensor comprising a magnetostrictive beam configured to have a first portion of that undergoes fixed-free vibration in response to changes in magnetic fields, and a second portion having a permanent magnet affixed thereto. The system also includes a computer including a processing apparatus programmed to generate a known magnetic field around each sensor, receive a signal including a magnetic field response from each sensor, compare the magnetic field response from each sensor with a calibration curve, and identify the environment surrounding each of the sensors based on the comparison between the magnetic field response and the calibration curve. The detected response varies based on whether the sensor is surrounded by air, water, or sediment.

Other features and advantages of the present invention will become apparent to those skilled in the art upon examination of the following or upon learning by practice of the invention.

BRIEF DESCRIPTION OF THE DRAWINGS

FIG. 1A depicts a conceptual diagram of a sensor.

DETAILED DESCRIPTION OF THE INVENTION

Figure 1B:
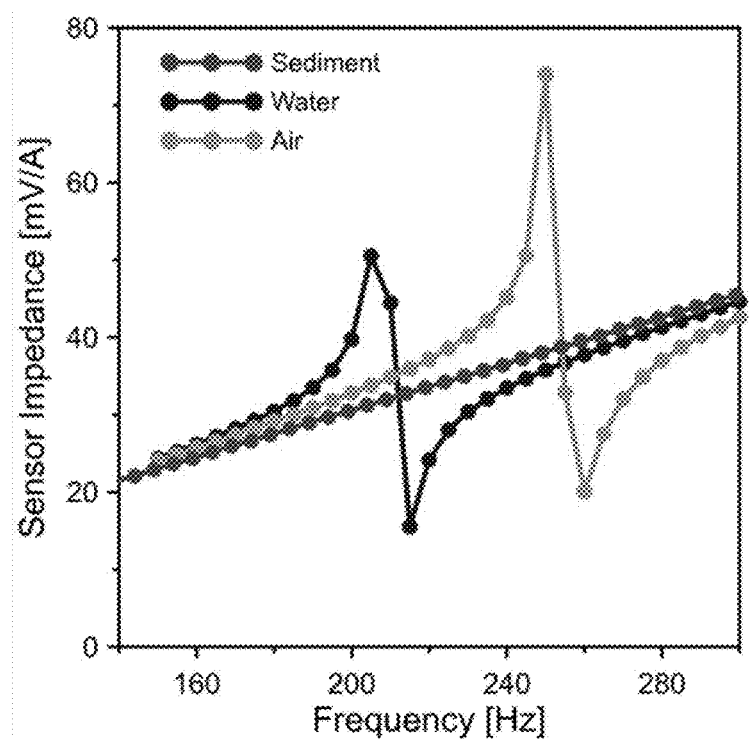
FIG. 1B is a graph depicting the experimental frequency response of the sensor impedance in air, water, and sediment, which is the ratio of the pickup coil voltage output to the driving coil current input.

The invention described herein, including the various aspects and/or embodiments thereof, meets the unmet needs of the art, as well as others, by providing active-mode sensors that may be used to detect air, water, and sediment interfaces, as well as systems and methods for sensing air, water, and sediment. The sensor is robust and withstands forces due to moving or shifting water and sediment.

The sensors, systems, and methods of the invention may be particularly beneficial when used in water tanks, such as ballast tanks in naval vessels. The sensors provide real-time information regarding ballast tank contents when filling or emptying tanks, and function regardless of whether the water tank is still or in motion. As part of naval applications in particular, a sensor is needed that can determine the amount of water and sediment in shipboard tanks, and distinguish between the interfaces in large-capacity water tanks. This is especially important in amphibious vessels, which may rapidly fill and empty their ballast tanks during operations conducted near shore, at anchor, or while underway at sea. Particularly when conducted near shore, ballasting operations may result in significant amounts of sediment and other substances being drawn into the ballast tanks along with water. Accurate understanding of ballast tank contents and levels is needed to operate naval vessels safely.

The sensors, systems, and methods are also useful in a variety of non-naval applications, including environmental sensing in areas surrounding bridges, canals, docks, and other infrastructure. These areas may be subject to fluctuations in levels of surrounding water and sediment, and detection of these variations can be critical for avoiding damage to infrastructure, providing an indication of when maintenance may be required, and preventing adverse impacts on ability to traverse the monitored areas.

Apparatus

In some aspects, the invention relates to a sensor apparatus that includes a magnetostrictive beam. A clamp is provided on the magnetostrictive beam, which is configured so a first portion of the magnetostrictive beam on a first side of the clamp undergoes fixed-free vibration in response to changes in magnetic fields. A second portion of the magnetostrictive beam on a second side of the clamp has a permanent magnet provided thereon. The permanent magnet biases the magnetostrictive beam. Pickup and driver coils are provided on either side of the clamp. The driver coil generates a known magnetic field, and the pickup coil measures the magnetic field response of the first portion of the magnetostrictive beam to the known magnetic field. The magnetic field response varies based on whether air, water, or sediment is adjacent to the magnetostrictive beam.

The magnetostrictive beam is not particularly limited in terms of shape, though a rectangular cross-section is useful for ease of fabrication and modeling the magnetostrictive response. However, the invention is not particularly limited by the cross-sectional shape of the magnetostrictive beam.

An exemplary sensor apparatus in accordance with the invention is depicted in FIG. 1A.

Sensing apparatus 100 includes a cantilever beam 10. The beam 10 is formed from a magnetostrictive material (i.e., a material that changes its dimensions in response to changes in magnetization, and changes its magnetization and permeability in response to changes in applied stress/strain). Preferably, the beam 10 is formed from a magnetostrictive material that is suitable for use in a variety of environmental conditions, including aqueous environments, and environments in which the sensors of the invention are partially or fully buried in sediment.

In some aspects of the invention, magnetostrictive material is a Galfenol (i.e., a $Fe_{1-x}Ga_x$) alloy. Galfenol functions as an actuator via a "direct" effect, and as a sensor via an "inverse" (or Villari) effect. Preferably, the Galfenol is crystallographically oriented such that the [001] direction is aligned with the length of the beam. This can be achieved, for example, by rolling and texturing sheets of the Galfenol material, which can then be cut to form a beam.

Galfenol alloys where x is from about 16 at % to about 19 at % (i.e., 16-19 at % Ga) are preferred. Small amounts of carbon (C), boron (B), and niobium carbide (NbC) may also be included in the Galfenol alloy. The iron (Fe) component could be provided in the form of scrap steel rather than pure iron. In other aspects of the invention, aluminum (Al) may replace some of the gallium. One presently-preferred Galfenol alloy is $Fe_{81.6}Ga_{18.4}$, though the invention is not limited to this alloy. The Galfenol alloy may optionally be subjected to surface treatments, such as galvanization, which may increase the resistance of the sensor to saltwater or other corrosion.

It should be understood that any variations in the composition of the Galfenol, as well as any optional surface treatments (such as galvanization) may change the magnetostrictive performance of the sensor, and require calibration of the response of the material when surrounded by air, water, sediment, or other substances.

In some aspects of the invention, cantilever beam 10 is a unimorph, which includes an active layer 12 and an inactive layer 14. The active layer 12 is a magnetostrictive layer that deforms in response to variations in magnetic fields, causing deformation and/or displacement in the unimorph cantilever. The active layer 12 is preferably formed from a Galfenol alloy. The inactive layer 14 may be formed from a material that has a magnetostrictive constant that is not equal to that of the magnetostrictive material of active layer 12, where maximum deformation/displacement occurs when the magnetostrictive constants of the active layer 12 and inactive layer 14 have opposite signs (positive/negative). The deformation and/or displacement of the cantilever is proportional to changes in magnetic field surrounding sensor 100.

The inactive layer 14 is not particularly limited, though non-magnetic materials are preferred. Materials having approximately the same thermal expansion rate as the active layer 12 may be preferred in some aspects of the invention. In some preferred aspects of the invention, inactive layer 14 is formed from a brass alloy (i.e., a Cu—Zn alloy, which may optionally include minor amounts of elements selected from the group consisting of As, Pb, P, Al, Mn, and Si). Brass is capable of withstanding exposure to saltwater, and maintaining robust responses even when subjected to temperature variations. Aluminum may also be used in some applications, but it is less suitable for use in high temperature applications, and can suffer from fatigue fractures.

The active and inactive material layers 12, 14 in beam 10 may be bonded using any technique that maintains a stable bond in aqueous and sediment environments. High temperature cement and epoxy are two presently-preferred bonding materials. However, any adhesive that works with metal can be used in accordance with the invention, so long as it creates a structural bond and does not absorb all of the deformation of the active layer (i.e., the glue layer stiffness should not be too low). Heat-based welding techniques (including, but not limited to, metal inert gas (MIG), tungsten inert gas (TIG), stick, and flux-cored arc welding) may also be used to bond the layers. For maximum performance (i.e., for minimizing the heat effect zone and maintaining the magnetostrictive performance of the Galfenol), friction welding and magnetic impulse welding techniques are preferred.

Regardless of the particular configuration of beam 10, it is preferably secured at one end, for example, using a clamp 30. The location of the clamp is selected so that the beam can undergo fixed-free vibration (i.e., vibration where one side of the beam is fixed, and the other is not fixed). In some aspects of the invention, the clamp is located so that at least about 50% of the beam can undergo fixed-free vibration. Preferably, at least about 66% of the cantilever is available for fixed-free vibration. More preferably, at least about 75% of the cantilever is available for fixed-free vibration.

In other aspects of the invention, the sensor may be configured to have a length that extends over the distance being monitored. In this configuration, it may be necessary to clamp the beam on both ends.

On the free end of beam 10, a pickup coil 40 is provided for measuring the magnetic field response of the Galfenol strip 12. Preferably, pickup coil 40 is positioned near clamp 30. Coil 40 may be formed using any suitable conductive material, with copper wire being preferred.

On the fixed end of beam 10, a driver coil 50 is provided for magnetic field generation in alternating current mode. Preferably, driver coil 50 is positioned near clamp 30. Coil 50 may be formed using any suitable conductive material, with copper wire being preferred.

A permanent magnet 60 is also provided on the fixed end of beam 10. Preferably, the sensor is configured so that driver coil 50 is located between clamp 30 and permanent magnet 60. Permanent magnet 60 applies a non-saturating bias field to the active layer 12, which maximizes vibrations in beam 10. The permanent magnet 60 is preferably oriented such that the magnetic field goes into or out of the layer (i.e., the north or south pole is in contact with the Galfenol layer). The magnetic strength is preferably optimized such that the magnetostrictive material operates in the linear region of the strain vs. field curve.

In order to provide an even magnetic field along the length of the active layer 12, it may be beneficial to provide two permanent magnets in contact with beam 10 (not shown). In this case, one permanent magnet should be placed on each end of the beam, each having a different magnetic pole facing the active layer 12 (i.e., the north pole in contact with the Galfenol layer at the clamped end and the south pole in contact with the Galfenol layer at the free end). The function of applying a bias field using permanent magnets is to configure the sensor at an optimized operational point. With a certain bias field, the actuation performance increases, as does sensing performance.

In operation, the magnetostrictive active layer 12 strains in response to changes in magnetic fields caused by the application of current in the driver coil 50. Because the inactive layer 14 is unaffected by the magnetic field, the asymmetric strain causes bending in the sensor 100. Because the sensor 100 is fixed at clamp 30, there is a stress concentration in the clamped region. The magnetic moment directions in the magnetostrictive active layer 12 are affected by the compressive or tensile stress. The changes in magnetic flux can be measured by the pickup coil 40. In addition, the resonance frequency of the system changes due to changes in the relative amounts of air, water, and sediment surrounding sensor 100. The changes in resonance frequency affect the magnetic performance, and can be used to determine what medium surrounds the sensor. In one aspect of the invention, two coils are used, one for alternating current (AC) magnetic field generation and the other for measuring the magnetic field response of the beam. The current produced by driver coil 50 and the voltage received by pickup coil 40 can be analyzed, for example, using an oscilloscope.

The magnetic field response changes based upon the surrounding media, even though the same magnetic field excitation is applied. The resonance frequency of the beam in air is 248 Hz, and 206 Hz in water. By choosing an operating vibrational frequency higher than the resonance frequencies in air and water (for example, 280 Hz), it is possible to separate the pick-up coil voltage response from differences in the surrounding environment when the beam is surrounded by air, water, or sediment (low to high, in that order).

Methods

The invention also provides methods for measuring levels of contents in a tank. An active-mode air-water-sediment level sensor based on a magnetostrictive material may be developed for a large capacity tank, in order to fabricate a more precise and reliable level measurement system. Improved level measurement accuracy leads to improved discharge efficiency, and both reduced cost and less waste when water treatment is required.

The sensors of the invention may be used in accordance with methods for detecting air-water-sediment interfaces and tank contents. When mounted in a water tank, the sensor and system may be used to monitor when water levels increase and decrease. Levels of sediment may also be detected and monitored. Based on the water and sediment levels detected in accordance with the methods of the invention, the contents may be modified by, for example, discharging water or removing accumulated sediment from the tank. When used in association with infrastructure in an open environment, water and sediment levels may be modified, for example, by dredging a canal or shipping lane to remove accumulated sediment, or altering water levels near a bridge by adjusting flow from a dam.

Figure 2:
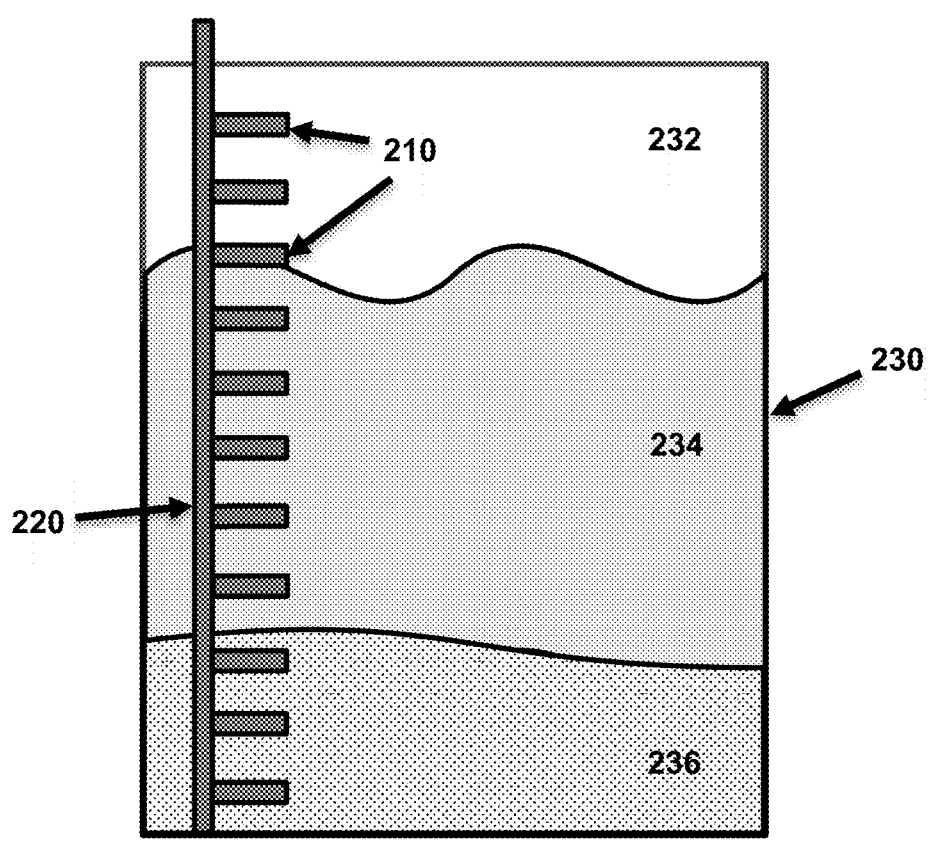
FIG. 2 is a diagram of an array of active-mode sensors provided in a tank that includes air, water, and sediment.

As shown in FIG. 2, the methods for sensing tank contents include providing a tank (such as a ballast tank in a vessel) which has an interior volume 230. However, volume 230 can also refer to an open area being monitored, such as environments near structures (e.g., bridges, docks, canals) that are subject to changes in water and sediment levels over time. The monitored volume 230 may contain one or more of air 232, water 234, and sediment 236, in varying amounts.

The method includes providing a magnetostrictive sensor 210 of the invention (as described above) affixed to a supporting member 220. Multiple sensors 210 may be provided, at locations that may be evenly spaced over the length of the supporting member 220, based on the desired sensitivity of the air-water-sediment detection. The sensors 210 may be oriented horizontally or vertically. Because this configuration includes a vertical array of horizontally oriented sensors, it is useful to minimize cross talk between sensors. This can be accomplished, for example, by choosing a dampening material as the structure of the supporting member 220, or by attaching the sensors 210 to the supporting member 220 using a damping material, such as silicone, rubber, etc.

It is also envisioned in accordance with the invention that uneven spacing of sensors may be desirable where more detailed information regarding sediment and water levels at particular areas in a tank or water column is needed. In that case, sensors 210 may be provided at a first, shorter spacing interval (for example, from 1 to 12 inches apart) in the area of interest, and at a second, longer spacing interval (for example, from 1 to 10 feet apart) in other areas where less detection sensitivity is required.

Regardless of configuration, supporting member 220 with sensors 210 is preferably fixed within the tank or environment being monitored so that the relative positioning of the sensors does not fluctuate significantly over time. With knowledge of the position of each sensor, water and sediment levels can be determined by detecting the media surrounding the sensors.

By generating a known magnetic field around the magnetostrictive beam of each sensor, and detecting the magnetic field response of the magnetostrictive beam, the contents of the tank can be determined regardless of motion of the tank contents or motion of the vessel that incorporates the tank. The magnetic field response of the magnetostrictive beam varies depending on whether the magnetostrictive beam is surrounded by air, water, or sediment, or combinations thereof, permitting the tank contents to be identified.

Systems

In another preferred aspect of the invention, an active-mode air-water-sediment level sensor based on a magnetostrictive material may be incorporated into a system for monitoring a large capacity tank or other environment subject to fluctuating levels of air, water, sediment, and other substances. Systems based on the sensors may be used to provide a more precise and reliable environmental monitoring system. Improved accuracy in measuring tank contents, for example, leads to improved discharge efficiency, and both reduced cost and less waste when water treatment is required. Improved ability to monitor conditions surrounding structures such as bridges, docks, and canals is beneficial to maintaining infrastructure and ensuring access.

Some systems in accordance with the invention include multiple sensors. The sensors may be mounted vertically in a water tank or ballast tank, or attached to a column that is affixed to a vertical bridge, canal, or dock structure. The sensors can also be arranged horizontally, for example, over an area that may be subject to periodic flooding.

Figure 3:
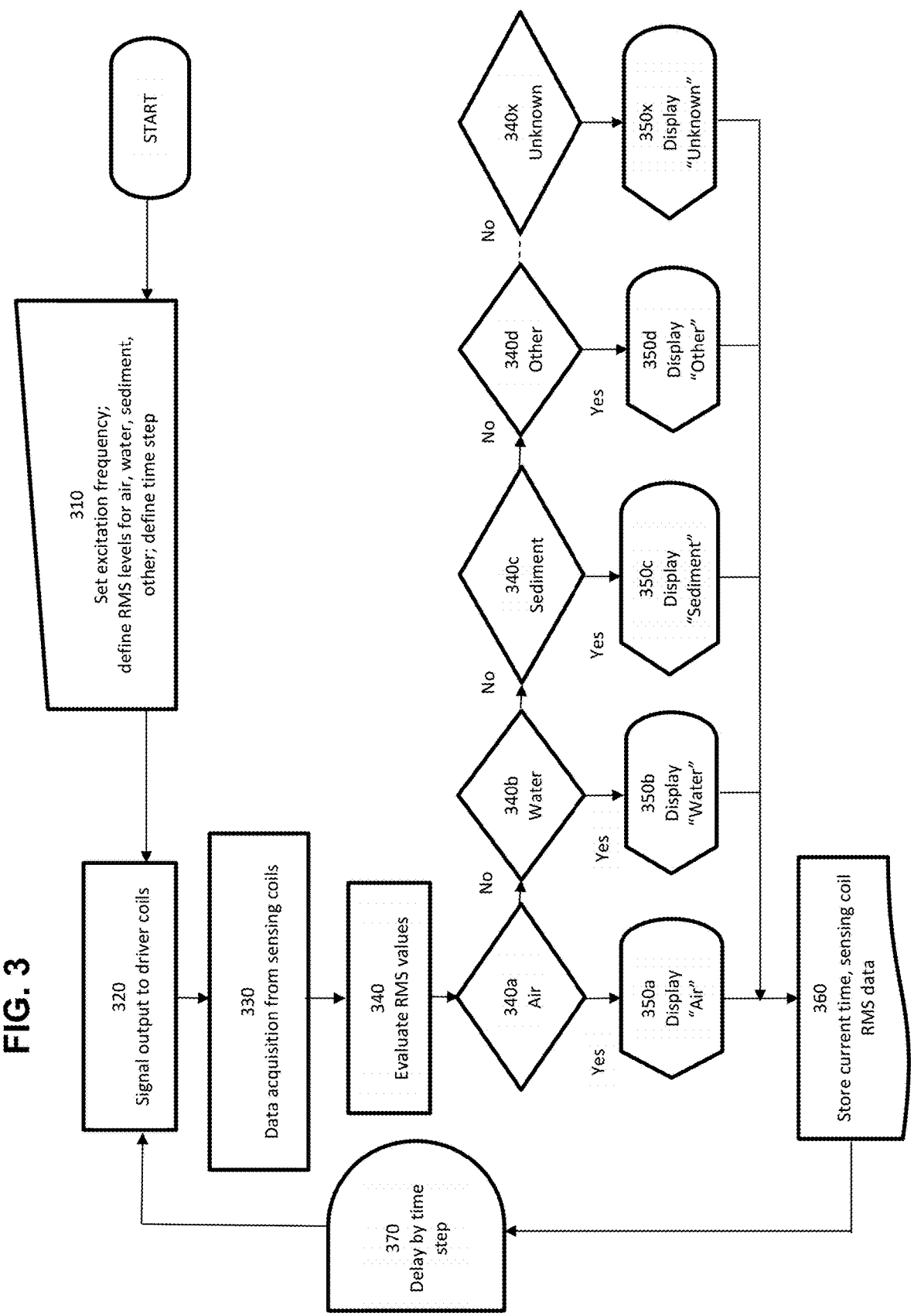
FIG. 3 is a flow chart detailing operation of the sensing system using the active-mode sensor.

FIG. 3 provides a flow chart for an exemplary system for managing an array of active-mode air-water-sediment level sensors. The flow chart assumes that the sensors have been previously calibrated so that detected responses received from each sensor to can be correlated to various media (air, water, sediment, other). The flow chart may be incorporated into software that is implemented by a computer or processor to operate the systems of the invention.

In step 310, user-defined input is entered, which may include parameters such as setting one or more excitation frequencies and/or voltages to be supplied at the driver coil; defining "Root Mean Square" (RMS) voltage signal for sensor beams surrounded air, water, sedimentation, or optionally other media; and defining a recurring time interval for delivering the excitation frequency and/or detecting a response.

Based on the user input from step 310, the processor sends a signal output to the driver coils of the sensors in step 320. The signal output may result in the same current and frequency being applied to each sensor; multiple currents and frequencies being applied to each sensor; or different currents and frequencies being applied to specific sensors in selected regions of the sensor array. The currents and frequencies applied to the driver coils of the sensors result in generation of magnetic fields at each sensor.

After the magnetic fields are generated at each of the sensors using the current and excitation frequency applied to the driver coils in step 320, each of the cantilever beams exhibits a response that is influenced by the medium surrounding the beam. These responses are detected when the pickup or sensing coils receive a voltage in step 330, which is acquired from the pickup coils using the processor or computer. The RMS voltage detected by the pickup coils changes due to variations in the medium surrounding the sensor.

The detected RMS voltage values from each pickup coil on each sensor are evaluated in step 340 by comparing to RMS voltage values at a given frequency that were identified during the calibration process.

For example, a range of values corresponding to the cantilever beam being surrounded by air are compared against the detected RMS voltage in 340a. If the detected RMS voltage is within the range identified for air, then the processor or computer outputs a result that the detected RMS voltage corresponds to a sensor surrounded by air as step 350a.

If the detected RMS voltage is not within the range identified for air, then a range of values corresponding to the cantilever beam being surrounded by water are compared against the detected RMS voltage in 340b. If the detected RMS voltage is within the range identified for water, then the processor or computer outputs a result that the detected RMS voltage corresponds to a sensor surrounded by water as step 350b.

If the detected RMS voltage is not within the ranges identified for air or water, then a range of values corresponding to the cantilever beam being surrounded by sediment are compared against the detected RMS voltage in 340c. If the detected RMS voltage is within the range identified for sediment, then the processor or computer outputs a result that the detected RMS voltage corresponds to a sensor surrounded by sediment as step 350c.

If the detected RMS voltage is not within the ranges identified for air, water, or sediment, then any additional ranges of values that have been identified as "other," if provided as optional input in step 310, are compared against the detected RMS voltage in 340d. If the detected RMS voltage is within the range identified for "other," then the processor or computer outputs a result that the detected RMS voltage corresponds to a sensor surrounded by "other" as step 350d. It should be understood that where RMS voltages are provided for particular substances, such as oil, the output can be adjusted to display or otherwise record the identified substance.

It should be appreciated that any number of different RMS voltage ranges and corresponding substances may be provided for use in the systems of the invention. In some aspects of the invention, tracking of water levels may be the only relevant parameter. In other aspects, tracking water and sediment may be sufficient. In other aspects, a multitude of parameters may be monitored.

If the detected RMS voltage is not within any of the ranges provided as user-supplied information, the system may also output a result that the detected RMS voltage does not correspond to a defined substance as step 350x. In this case, raw RMS voltage data may also optionally be output so that a user can consider the significance of the result and whether further analysis is required. The system may optionally be configured to calculate and output ratios of two or more substances that may correspond to the detected result as part of step 350x.

The results output by the processor or computer may be provided in the form of a visual indication in a graphical display that is provided, for example, on a computer monitor display or a cell phone application display. The graphical display can give a written indication (i.e., the words "air," "water," "sediment," or "other"), or a color-coded visual signal (such as displaying the color blue for sensors surrounded by water, brown for sensors surrounded by sediment, white for sensors surrounded by air). The output may also be provided as an entry in a table, chart, or database used to track the results without communicating the result to a user via a display.

Each detected RMS value for each sensor in the array is stored in memory or recorded in a database in step 360.

In step 370, the system waits for a user-defined time interval before repeating step 320. The interval may range from several seconds, to several days for environments not subject to rapidly changing conditions. This provides the ability to track changes in the detected environment surrounding each sensor over time.

Data may be stored for periods of months or years to permit analysis of long-term environmental conditions of structures, and may also be used to detect seasonal variations. Data may be stored for shorter periods (a few minutes, hours, or days) when used to monitor a specific bilge water intake or discharge operation.

One exemplary platform for programming the methods of the invention is LabVIEW® (National Instruments, Austin, Tex.), but the invention is not limited to the use of any particular programming language. The program may be stored in a suitable storage medium (such as a memory module or other computer-readable medium) and implemented using any suitable processor or computer. The processor or computer carrying out the program instructions functions as a special purpose machine, configured to cause a voltage to be transmitted a driver coil of the sensor or sensors (thereby generating a known magnetic field in each sensor), and receive data regarding changes in magnetic flux from a pickup coil of the sensor or sensors (which may vary for each sensor, depending on the medium surrounding it).

The processor or computer may transmit data regarding a voltage to be supplied to a driver coil, and receive data from the sensor or sensors, either wirelessly or by wired connections.

For detecting fluid levels, the systems of the invention may incorporate a series of sensors, stacked vertically, with the cantilever beam oriented vertically or horizontally.

For sediment detection, the beam is no longer in a fixed-free condition, because the sediment restricts the cantilever motion. The resonance frequency for a cantilever beam surrounded by sediment is therefore lower than the resonance frequency of a cantilever beam surrounded by air or water. Ratios of liquid and sediment may be used to compare with a received signal from a cantilever beam if the signal has an indeterminate resonance frequency possibly indicating that the beam is surrounded by mud or a slurry of solids. Ratios of liquid and "other" substances may be used to compare with a received signal from a cantilever beam if the signal has an indeterminate resonance frequency possibly indicating that beam is surrounded by an unknown substance or a mixture of an unknown substance and water. The "other" substances may include, but are not limited to, oil, biological, and organic contaminants. These mixed environments can be more difficult to accurately detect because the resonance frequencies of the cantilever beams change more gradually when they are surrounded by these other media or mixtures of other media and water. Calibration of the resonance frequency of the beam when surrounded by various media and mixtures of media the driving signal Based on calibration factors (which may be determined through calibration of the cantilever beam), and the received data from the sensors, the programmed computer determines the particular medium that surrounds the sensor or sensors. This information may be tracked over time to detect air, water, sediment, and other substances in the area being monitored using the systems of the invention. When combined with information regarding the positions of each of multiple sensors, water levels and locations of interfaces between air, water, and sediment may be determined.

A user interface is optionally included in the systems of the invention, and may provide a real-time, immediate screen readout of the detected water, air, and sediment layers in an enclosed tank, or in a monitored open environment. A computer memory or database file may also be provided to track the detected water, air, and sediment surrounding each sensor, and/or plot estimated water and sediment levels as a function of time over time. The systems of the invention may also be used to track the resonance frequency of one or more sensors over time, with highlighted regions corresponding to frequencies for air/water/sediment.

EXAMPLES

The invention will now be particularly described by way of example. However, it will be apparent to one skilled in the art that the specific details are not required in order to practice the invention. The following descriptions of specific embodiments of the present invention are presented for purposes of illustration and description. They are not intended to be exhaustive of or to limit the invention to the precise forms disclosed. Many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated.

Example 1. Construction of Galfenol Water Level Sensor

The unimorph sensor composed of a Galfenol strip ($Fe_{81.6}Ga_{18.4}$) is machined from a directionally solidified rod from Etrema Products, Inc. (Ames, Iowa; now defunct) as shown in FIG. 1A. The [100] direction is along the length of the sheet. The Galfenol strip is attached to a brass beam using a high temperature cement (Vishay, M-bond 610). The dimensions of the combined structure are 77.80 mm long by 9.85 mm wide by 2.41 mm thick. The beam is clamped so that 58.10 mm is left for fixed-free vibration. Next to the clamp towards the free end of the cantilever is a 100 turn 30-gauge copper pickup coil. On the other side of the clamp is a 30 turn 24-gauge copper driving coil. The coils were prepared by wrapping wire around additively manufactured polymer bobbins. The final component of the system is a permanent magnet affixed behind the driving coil which applies a non-saturating bias field to the Galfenol along the length of the strip; this allows the beam to operate within a linear region with high slope, in order to achieve maximal vibrations. [A. E. Clark et al., "Modern magnetostrictive materials: classical and nonclassical alloys," *Proc. SPIE* 4699, *Smart Structures and Materials* 2002: *Active Materials: Behavior and Mechanics* (11 Jul. 2002).] Experiments were performed to characterize the sensor in expected environmental conditions.

Example 2. Frequency Response Test

For the experiments, an arbitrary waveform generator (Agilent, 33210A) was set to an AC voltage of 100 mV, at various frequencies, which was amplified through the power amplifier (Kepco, BOP 100-2M) to increase the power to the driving coil. The current produced from the driving coil and the voltage received by the pickup coil are both read by the digital oscilloscope (Agilent, DSOX3014A). At each interval, the oscilloscope recorded the pickup coil and driving coil at a rate of 10,000 samples per second for one second. The data is analyzed by calculating the root mean squares of the sine curves. The pickup coil will detect the magnetic flux density through the Galfenol beam generated by the driving coil. Usually, the pickup coil voltage response linearly increases as the frequency increases. At the same time the magnetic flux density through the Galfenol beam is a function of stress, so the magnetic flux density variation will be affected by the stress of the beam. In sediment, the beam will not move and the pickup coil response will follow the magnetic flux density variation generated by the driving coil. FIG. 1B shows a low resolution frequency sweep in air, water and sediment. The natural frequency of the first mode for water is lower than air since the water acts as added mass for the cantilever. In each curve, the frequency with the highest response is the location of the first mode of the natural frequency of the bilayer, while the frequency with lowest response is the anti-resonance. The first mode resonant frequency of the cantilever beam was measured to be about 248 Hz in air and about 206 Hz in water. For the purpose of these tests, 280 Hz was determined to be the optimal input frequency, since it was located after the highest anti-resonance; it is also convenient that the response value increases when switching from air to water to sediment. Further increase of the frequency to 300 Hz will give less signal differences between air, water and sedimentation.

Example 3. Submersion Test

While multiple cantilevers could be used in the horizontal condition to give a discrete, binary response of water or air coverage, a vertical orientation allows for a continuous determination of water level over the length of the cantilever. The resolution of this vertical measurement was evaluated.

Figure 4A:
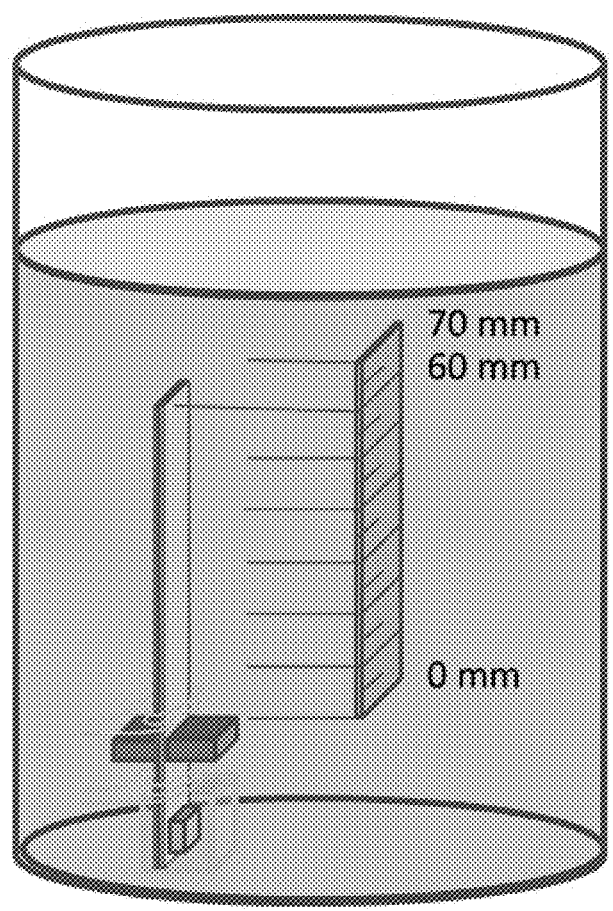
FIG. 4A shows an experimental setup for water level measurement.
Figure 4B:
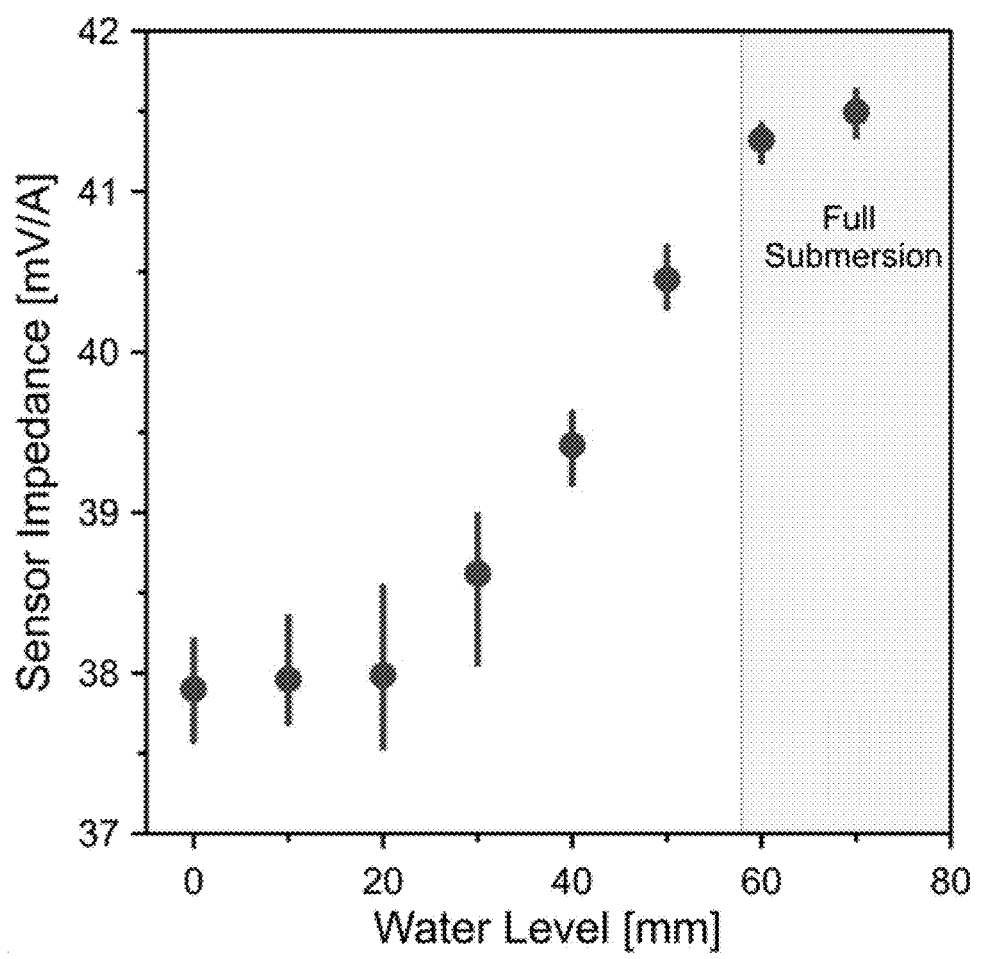
FIG. 4B is a graph showing sensor impedance as a function of submersion level.

In order to properly characterize the change in natural frequency due to the addition of water mass, a submersion test was conducted. The sensor was suspended vertically with the free end facing up within a beaker, as shown in FIG. 4A; the sensor remained stationary during the testing. Room temperature water was added in 10 mm increments, beginning at the clamped section of the beam until total submersion. Then, the process was reversed, draining water from the system. The six times averaged ratio in between output of the pickup coil and current input to the driving coil (impedance) can be seen in FIG. 4B (three tests, ascending and descending water levels), where 0 mm correlates to the sensor in air and 70 mm cases are total submersion. Overall, there is a 10% increase in response due to a decrease in the natural frequency of the first mode of the cantilever beam. The flattening at the top of the curve is due to the sensor actually achieving full submersion just over 60 mm. The purpose of the submersion test was to determine if the device could function as an analog sensor along the length of the beam. There are sections in which a resolution of 10 mm could be identified, however, water coverage closer to the clamped end of the beam is not as clear.

Example 4. Temperature Test

The second experiment is a temperature performance evaluation. As temperature increases in both air and water, the cantilever response will change. There may be overlap between the low temperature air response and the high temperature water response, which is of concern as water and air temperatures can fluctuate significantly within ship tanks depending on the ships' global location (i.e., equatorial waters vs. North Atlantic). The sensor response as a function of temperature was therefore evaluated.

To understand the possible effects of temperature changes on the system, the sensor temperature was increased from 25° C. to 80° C. in both water and air. In water, the sensor system was once again suspended with the free end up in a beaker of water so that the sensor was completely submerged but remained off of the bottom to avoid heat conduction directly from the glass. The beaker was placed on an externally controlled hotplate affixed with a thermocouple which monitored the water temperature at the same height as the sensor. The temperature of the beaker was increased from 25° C. to 30° C. and then by 10° C. increments to 80° C. At each point, the power controller was turned off to eliminate noise produced by the thermocouple and data was taken in a short period of time (t<10 sec). This lead to a maximum temperature error of ±2° C. After reaching 80° C., the water was replaced with cool water to restart the data collection.

For the cantilever sensor in air, the MTS 651 Environmental Chamber was utilized as a heater with a thermocouple placed on top of the clamp at the fixed end of the beam. Since air conducts heat less efficiently than water, three minutes was allowed for the cantilever to adjust to each temperature before recording the data in the oscilloscope. Before repeating each round of data collection, the cantilever was allowed to cool to room temperature.

Figure 5A:
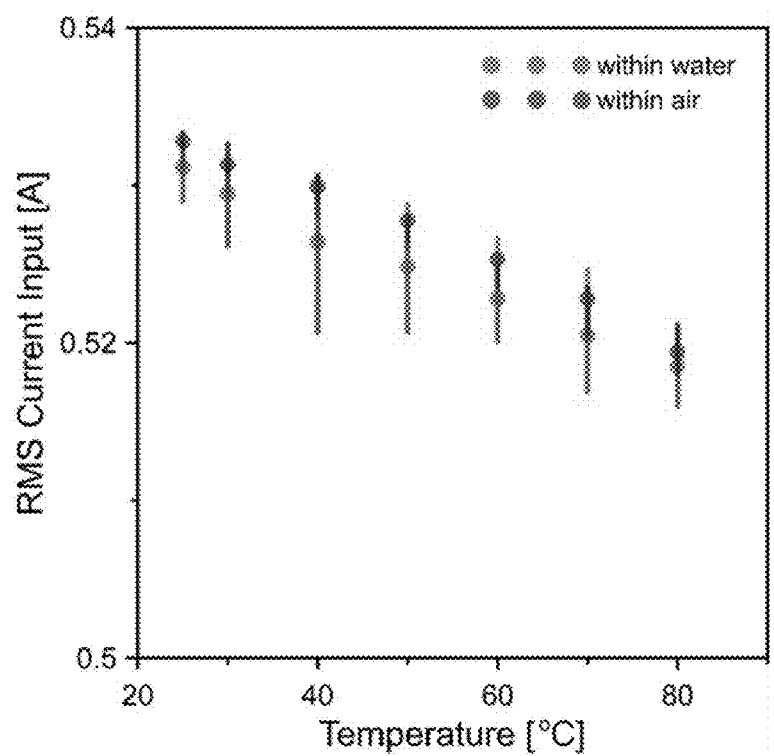
FIG. 5A is a graph depicting the effect of temperature on the driving current to the driving coil.
Figure 5B:
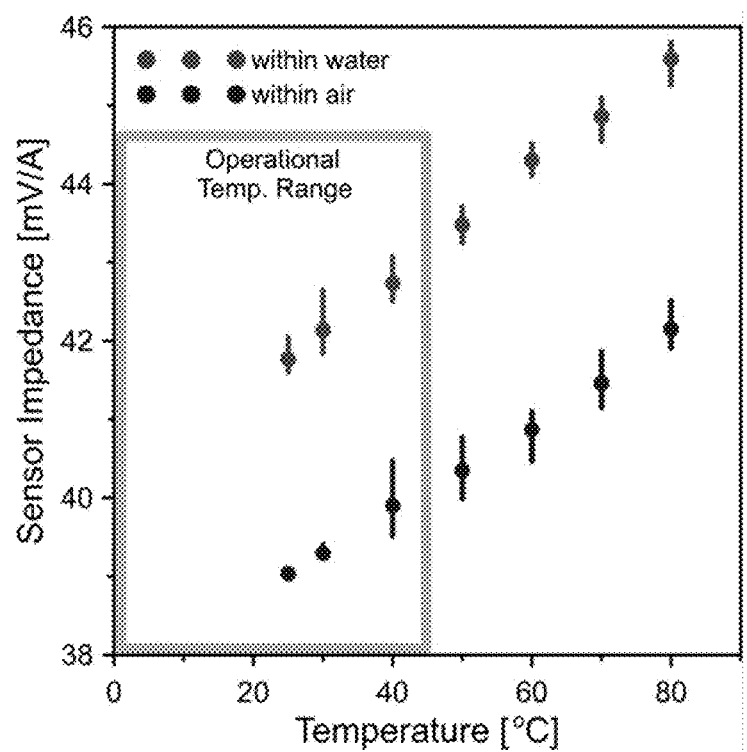
FIG. 5B is a graph depicting sensor impedance as a function of environmental temperature.

The temperature tests were conducted three times each while in air and submerged in water. FIG. 5A shows the driving coil current response which can be seen to have a decline in amperage of about 2.5% when the temperature was changed from 25° C. to 80° C. Since the current is inversely proportional to the resistance and the resistance increases due to the thermal resistivity coefficient of copper in the driving coil and pickup coil, the trend agrees with Ohm's law (I=V/R). The resistance change was also individually measured with respect to the change in temperature and showed a 1.2% change. Therefore, the change in the resistance of the coil is contributing about one-half of the change in the current. Other than resistance changing with temperature, the temperature effect on magnetization of Galfenol and mechanical softening of the beam may contribute to the other half of the observed change in the current. In FIG. 5B, the ratio of the voltage response of the pickup coil to the current input can be seen where the air test and water test both display a linear increase. The air response starts at about 39.0 mV/A at room temperature and increases to about 42.2 mV/A, exhibiting an 8.2% change. The water response starts at 41.8 mV/A and increases to 45.6 mV/A, equating to a 9.1% change. The average difference between the responses in air and water is 7.7% which is smaller but of the same magnitude as the previous submersion experiment. It should also be noted that the response in air at 80° C. is higher than the response of water at room temperature; this would complicate a potential (but unanticipated) binary submersion measurement with room temperature water in an otherwise hot environment.

With respect to sensor usage in a water tank, temperature changes should remain an insignificant factor while identifying between submersion in water and air. Although the sensor in air at 80° C. overlaps with water submersion at room temperature, water tank temperatures are not expected to exceed 40° C. Therefore, under expected ambient temperatures, there is still a clear signal separation between water and air.

CONCLUSIONS

An active-mode air-water-sediment level sensor based on magnetostrictive materials was constructed and characterized using various testing methods for use as either an analog or binary water level sensor. The resolution of the beam was determined through a submersion test in which the water level was increased by 10 mm increments. As expected, the natural frequency of the system decreased which caused the induced voltage response to increase by 10%. The second test attempted to discern environmental variability in sensor response, looking at changes in temperature while submerged in water and air. The relative sensor response was evaluated from room temperature (25° C.) to 80° C., and while the amperage of the driving coil decreased linearly with a rise in temperature due to increases in the resistance of the driving coil, the sensor response showed a 9.1% linear increase in voltage response in water and 8.2% in air. The air and water values overlapped slightly within the temperature regions tested ($V_{air,RT} \approx 41.8$ mV/A; $V_{water, 80° C.} \approx 42.2$ mV/A). The results show that the sensor is fully capable of identifying mediums of air and water up to at least 40° C. under current operating conditions.

It will, of course, be appreciated that the above description has been given by way of example only and that modifications in detail may be made within the scope of the present invention.

Throughout this application, various patents and publications have been cited. The disclosures of these patents and publications in their entireties are hereby incorporated by reference into this application, in order to more fully describe the state of the art to which this invention pertains.

The invention is capable of modification, alteration, and equivalents in form and function, as will occur to those ordinarily skilled in the pertinent arts having the benefit of this disclosure. While the present invention has been described with respect to what are presently considered the preferred embodiments, the invention is not so limited. To the contrary, the invention is intended to cover various modifications and equivalent arrangements included within the spirit and scope of the description provided above.

What is claimed:
1. A sensor, comprising:
 a magnetostrictive beam;
 a clamp provided on the magnetostrictive beam, configured so a first portion of the magnetostrictive beam on a first side of the clamp undergoes fixed-free vibration in response to changes in magnetic fields, and a second portion of the magnetostrictive beam on a second side of the clamp;
 a permanent magnet provided on the second portion of the magnetostrictive beam; and
 pickup and driver coils provided on either side of the clamp,
 where the driver coil generates a known magnetic field, and the pickup coil measures the magnetic field response of the first portion of the magnetostrictive beam to the known magnetic field.

2. The sensor of claim 1, where the magnetic field response varies based on media surrounding the magnetostrictive beam.

3. The sensor of claim 2, where the media are selected from the group consisting of air, water, sediment, and combinations thereof.

4. The sensor of claim 1, where the magnetostrictive beam comprises an active layer and a passive layer.

5. The sensor of claim 4, where the active layer comprises an alloy of $Fe_{1-x}Ga_x$.

6. The sensor of claim 5, where x is from about 16 at % to about 19 at %.

7. The sensor of claim 4, where the passive layer comprises a brass alloy.

8. A method for sensing, comprising:
 providing a volume that contains one more media comprising air, water, and sediment in varying amounts;
 providing two or more sensors within the volume, each sensor comprising a magnetostrictive beam configured to have a first portion of that undergoes fixed-free vibration in response to changes in magnetic fields, and a second portion having a permanent magnet affixed thereto;
 generating a known magnetic field around the magnetostrictive beam of each of the two or more sensors;
 detecting a magnetic field response in the first portion of the magnetostrictive beam of each of the two or more sensors; and
 where the magnetic field response varies in accordance with a medium surrounding each magnetostrictive beam.

9. The method of claim 8, where the volume comprises a tank.

10. The method of claim 8, where the volume comprises an area surrounding a structure.

11. The method of claim 10, where the structure is selected from the group consisting of bridges, canals, and docks.

12. The method of claim 8, where the magnetostrictive beam comprises an active layer and a passive layer.

13. The sensor of claim 12, where the active layer comprises an alloy of $Fe_{1-x}Ga_x$.

14. The sensor of claim 13, where x is from about 16 at % to about 19 at %.

15. The sensor of claim 12, where the passive layer comprises a brass alloy.

16. A sensing system, comprising:
 an array of active-mode magnetostrictive sensors, each sensor comprising a magnetostrictive beam configured to have a first portion of that undergoes fixed-free vibration in response to changes in magnetic fields, and a second portion having a permanent magnet affixed thereto; and
 a computer comprising a processing apparatus programmed to
 generate a known magnetic field around each sensor, receive a signal comprising a magnetic field response from each sensor, compare the magnetic field response from each sensor with a calibration curve, and identify the environment surrounding each of the sensors based on the comparison between the magnetic field response and the calibration curve.

17. The sensing system of claim 16, further comprising a user interface for displaying the identified environment surrounding each of the sensors as an output.

18. The sensing system of claim 16, further comprising a computer-readable media for storing the identified environment surrounding each of the sensors.

19. The sensing system of claim 16, where the array of active-mode magnetostrictive sensors comprises two or more sensors affixed to a supporting member.

20. The sensing system of claim 16, where the array of sensors is provided in a ballast tank of a vessel.

* * * * *